(12) United States Patent
Lee et al.

(10) Patent No.: US 7,952,676 B2
(45) Date of Patent: May 31, 2011

(54) CONNECTION STRUCTURES CAPABLE OF REDUCING DISTORTION OF SIGNAL

(75) Inventors: Seung-Bae Lee, Yongin-si (KR); Jung-Man Lim, Ohsan-si (KR); Se-Il Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 503 days.

(21) Appl. No.: 12/002,173

(22) Filed: Dec. 14, 2007

(65) Prior Publication Data

US 2008/0143913 A1    Jun. 19, 2008

(30) Foreign Application Priority Data

Dec. 15, 2006    (KR) .................. 10-2006-0128841

(51) Int. Cl.
    *G02F 1/1345*    (2006.01)
    *H01R 4/66*    (2006.01)
    *H01R 13/58*    (2006.01)
    *H01R 9/03*    (2006.01)

(52) U.S. Cl. ........ 349/152; 349/149; 349/150; 349/151; 439/101; 439/108; 439/604; 439/607.49

(58) Field of Classification Search .................. 439/181, 439/924.1
    See application file for complete search history.

(56) References Cited

U.S. PATENT DOCUMENTS

| 4,824,377 | A | * | 4/1989 | De Burro ....................... 439/186 |
| 5,066,240 | A | * | 11/1991 | Verdun ......................... 439/181 |
| 5,160,272 | A | * | 11/1992 | Zell et al. ..................... 439/101 |
| 6,099,745 | A | | 8/2000 | McKenney et al. |
| 7,092,061 | B2 | | 8/2006 | Hong |
| 2004/0032553 | A1 | | 2/2004 | Hong |
| 2005/0007354 | A1 | | 1/2005 | Yamada |
| 2006/0189195 | A1 | * | 8/2006 | Okada ........................... 439/325 |

FOREIGN PATENT DOCUMENTS

| JP | 7-202357 | 8/1995 |
| JP | 2001-53409 | 2/2001 |
| KR | 20000075227 | 12/2000 |
| KR | 20010051276 | 6/2001 |
| KR | 2001-0071409 | 7/2001 |
| KR | 1020040016222 A | 2/2004 |
| KR | 1020040104375 | 12/2004 |
| KR | 10-2005-0110747 | 11/2005 |
| KR | 1020050112358 | 11/2005 |
| KR | 10-2006-0018545 | 3/2006 |
| WO | WO 99/63552 | 12/1999 |

* cited by examiner

*Primary Examiner* — Hoan C Nguyen
(74) *Attorney, Agent, or Firm* — Mills & Onello, LLP

(57) ABSTRACT

Provided is a connection structure capable of reducing the distortion of a signal. The connection structure includes a first interconnection layer including a plurality of signal lines configured to transmit an operating signal generated by a driver to a receiver; a second interconnection layer including at least one ground line configured to connect the driver and ground terminals of the receiver; and an insulating layer interposed between the first and second interconnection layers to electrically insulate the signal lines from the ground line.

19 Claims, 8 Drawing Sheets

CONNECTION STRUCTURES CAPABLE OF REDUCING DISTORTION OF SIGNAL

CROSS REFERENCE TO RELATED APPLICATIONS

This application relies for priority upon Korean Patent Application No. 10-2006-0128841, filed on Dec. 15, 2006, the contents of which are herein incorporated by reference in their entirety.

BACKGROUND OF THE INVENTION

1. Field of the Invention

The present invention relates to a connection structure that connects electronic devices, and more particularly, to a connection structure capable of reducing the distortion of signals.

2. Description of the Related Art

A connection structure is used to electrically connect electronic devices formed on different substrates. For example, a liquid crystal display (LCD) includes a liquid crystal panel having 2-dimensionally arranged pixels, driver circuits connected to the pixels, and a timing controller that transmits an operating signal to the driver circuits using a predetermined connection structure. The connection structure used for transmitting the operating signal includes connectors, which are attached to the timing controller and the driver circuits, respectively, and an interconnection structure, which provides an electrical path between the connectors.

According to the conventional art, a flexible printed circuit (FPC) board including a base film and single-layered interconnection lines disposed on the base film is used as the interconnection structure. The single-layered interconnection lines include a signal line for transmitting an operating signal, a power line for applying a power supply voltage, and a ground line for applying a ground voltage. Also, the connector has a structure corresponding to the interconnection line of the interconnection structure. That is, the connector includes a socket into which the signal line, the power supply line, and the ground line are inserted, and the socket includes terminals arranged to correspond to the signal line, the power supply line, and the ground line, respectively.

Meanwhile, the operating signal is transmitted to the driver circuit through the signal line to generate a return current that returns to the timing controller through the ground line. However, when the connection structure includes a long signal transmission path or structurally generates an inductive component, the return current can contain a transient voltage noise. In this case, the waveform of the operating signal can be deformed or electromagnetic interference (EMI) can occur.

SUMMARY OF THE INVENTION

The present invention provides a connection structure that can reduce the distortion of signals.

Also, the present invention provides a liquid crystal display (LCD) including a connection structure capable of reducing the distortion of signals.

According to an aspect of the present invention, there is provided a connection structure including a double layered interconnection structure. The connection structure includes a first interconnection layer including a plurality of signal lines configured to transmit an operating signal generated by a driver to a receiver. A second interconnection layer includes at least one ground line configured to connect ground terminals of the driver and the receiver with each other. An insulating layer is interposed between the first and second interconnection layers and electrically insulates the signal lines from the ground line.

The length of the ground line can be shorter than or equal to the length of the signal lines.

The width of the ground line can be greater than the sum of the widths of the signal lines.

The insulating layer can further include an adhesive layer configured to adhere the insulating layer to the first and second interconnection layers.

The connection structure can further include a shielding layer interposed between the first and second interconnection layers and electrically floated.

The shielding layer can extend and enclose the first interconnection layer.

The connection structure can further include at least one power supply line configured to connect ground terminals of the driver and the receiver with each other. In this case, the power supply line can be disposed in at least one of the first and second interconnection layers.

The connection structure can further include a connector configured to connect the first and second interconnection layers to one of the driver and the receiver. The connector can include signal terminals connected to the signal lines of the first interconnection layer and a ground terminal connected to the ground line of the second interconnection layer.

Furthermore, the connector can include a first socket unit into which the first interconnection layer is inserted and a second socket unit into which the second interconnection layer is inserted. The second socket unit can have a greater socket depth than the first socket unit.

The driver can be a timing controller of a liquid crystal display (LCD), and the receiver can be a gate/source driver circuit of the LCD.

According to another aspect of the present invention, there is provided an LCD including a double layered interconnection structure. The LCD includes a timing controller including a first connector; a panel on which gate/source driver circuits including second connectors are disposed; and an interconnection structure inserted into the first and second connectors and configured to connect the timing controller and the gate/source driver circuits. The interconnection structure includes: a first interconnection layer including signal lines configured to transmit an operating signal generated by the timing controller to the gate/source driver circuits; and a second interconnection layer including a ground line configured to connect the timing controller and ground terminals of the gate/source driver circuit.

The length of the ground line can be shorter than or equal to the length of the signal lines.

The width of the ground line can be greater than the sum of the widths of the signal lines.

The interconnection structure can further include: an insulating layer interposed between the first and second interconnection layers and configured to electrically isolate the first interconnection layer from the second interconnection layer; and an adhesive layer interposed between the insulating layer and the first and second interconnection layers.

The interconnection structure can further include a shielding layer interposed between the first and second interconnection layers and electrically floated.

The shielding layer can be extended to enclose the first interconnection layer.

The interconnection structure can further comprise at least one power supply line configured to connect the timing controller and the ground terminals of the gate/source driver circuits, wherein the power supply line is disposed in at least one of the first and second interconnection layers.

Each of the first and second connectors can include signal terminals connected to the signal lines of the first interconnection layer and a ground terminal connected to the ground line of the second interconnection layer.

Each of the first and second connectors can include a first socket unit into which the first interconnection layer is inserted and a second socket unit into which the second interconnection layer is inserted, wherein the second socket unit has a greater socket depth than the first socket unit.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF PREFERRED EMBODIMENTS

Figure 1:
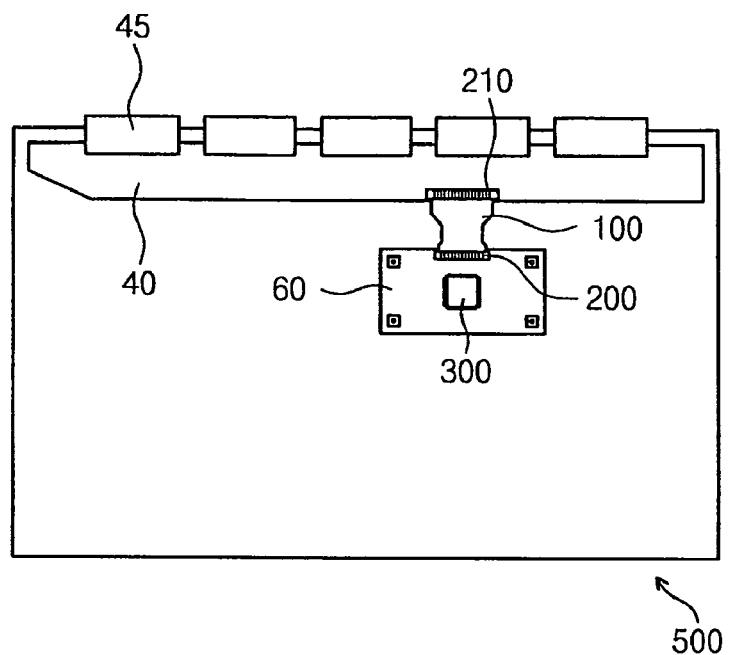
FIGS. 1 and 2 are perspective views of an embodiment of a liquid crystal display (LCD) according to an aspect of the present invention.

Reference will now be made in detail to the preferred embodiments in accordance with aspects of the present invention, examples of which are illustrated in the accompanying drawings. However, the present invention is not limited to the embodiments illustrated hereinafter.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will also be understood that when a layer is referred to as being "on" another layer or substrate, it can be directly on the other layer or substrate, or intervening layers can also be present. In the drawings, the thicknesses of layers and regions are exaggerated for clarity. It will be understood that although the terms first and second are used herein to describe various regions, layers and/or sections should not be limited by these terms. These terms are only used to distinguish one region, layer or section from another region, layer or section. Thus, for example, a first layer discussed below could be termed a first layer without departing from the teachings of the present invention. Each embodiment described and illustrated herein includes complementary embodiments thereof.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 2:
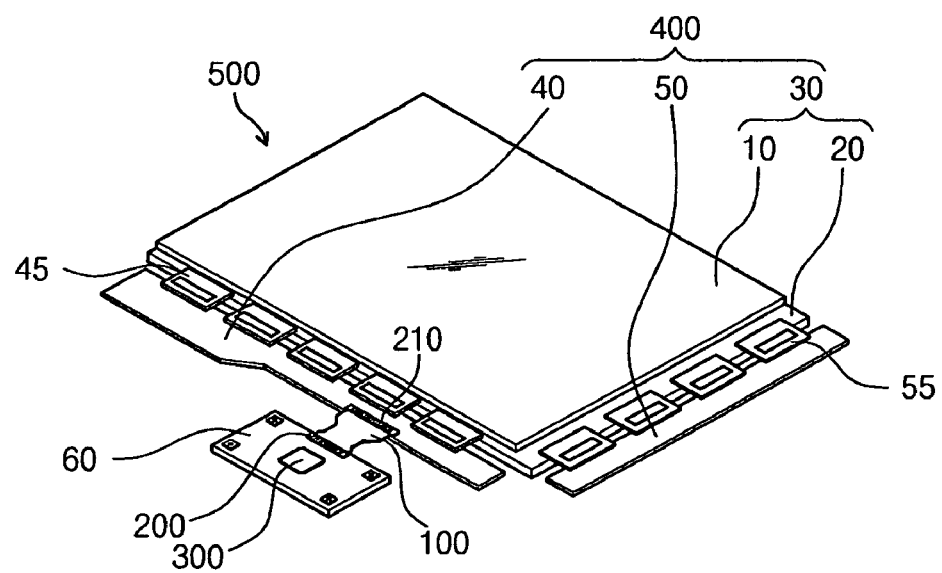

FIGS. 1 and 2 are perspective views of an embodiment of a liquid crystal display (LCD) 500 according to an aspect of the present invention.

Referring to FIGS. 1 and 2, the LCD 500 includes an LCD unit 400, a control printed circuit board (PCB) 60, and a control interconnection structure 100.

The LCD unit 400 includes a liquid crystal display (LCD) panel 30, a source PCB 40, and a gate PCB 50. The LCD panel 30 includes a thin film transistor (TFT) substrate 20 on which TFTs are 2-dimensionally arranged, a color filter substrate 10 disposed on the TFT substrate 20, and an LCD layer (not shown) injected between the TFT substrate 20 and the color filter substrate 10. A data line (not shown) is connected to source terminals of the TFTs, a gate line (not shown) is connected to gate terminals of the TFTs, and a pixel electrode (not shown) formed of a transparent conductive material is connected to drain terminals of the TFTs. The color filter substrate 10 is spaced a predetermined distance apart from the TFT substrate 20 using spacers. Color filters (not shown) are disposed on the color filter substrate 10. The color filters enable light passing through the liquid crystal layer to have wavelengths corresponding to different colors (e.g., red (R), green (G), and blue (B) colors).

The LCD panel 30 is electrically connected to the source and gate PCBs 40 and 50 through a source interconnection structure 45 and a gate interconnection structure 55, respectively. The source and gate PCBs 40 and 50 are electrically connected to the control PCB 60 through the control interconnection structure 100. A timing controller 300 and a control connector 200 are disposed on the control PCB 60. The timing controller 300 functions to generate operating signals to drive the LCD panel 30, and the control connector 200 functions to transmit the operating signals to the source and gate PCBs 40 and 50. The operating signals are transmitted through the control connector 200 and the control interconnection structure 100 to the source and gate PCBs 40 and 50. Thereafter, the operating signals are transmitted through the source and gate interconnection structures 45 and 55 to the LCD panel 30. For this, source and gate connectors 210, which are connected to the control interconnection structure 100, can be further disposed on the source and gate PCBs 40 and 50, respectively.

In this case, each of the control interconnection structure 100 and the source and gate interconnection structures 45 and 55 can correspond to an interconnection structure that will be described with reference to FIGS. 3 through 9, while each of the control connector 200 and the source and gate connectors 210 can be a connect that will be described with reference to FIGS. 10 through 12. Furthermore, connectors that will be described with reference to FIGS. 10 through 12 can be further disposed on the LCD panel 30 and the source and gate PCBs 40 and 50 to connect the source and gate interconnection structures 45 and 55.

Figure 3:
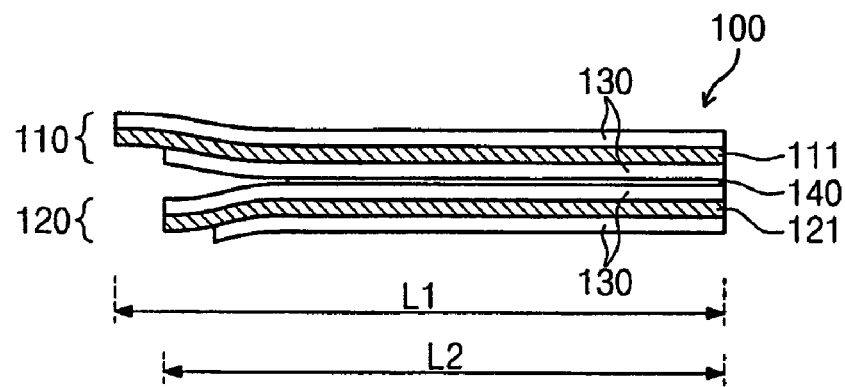
FIGS. 3 through 5 are cross-sectional views of an embodiment of an interconnection structure according to aspects of the present invention, which are taken in a first direction.
Figure 4:
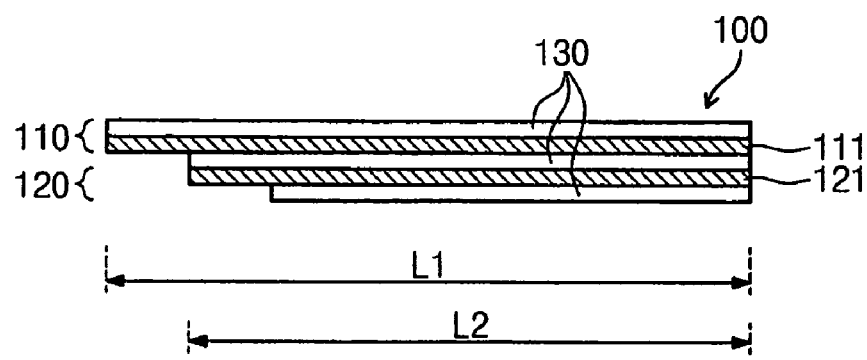
Figure 5:
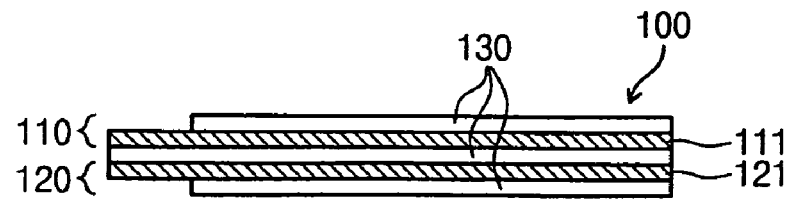
Figure 6:
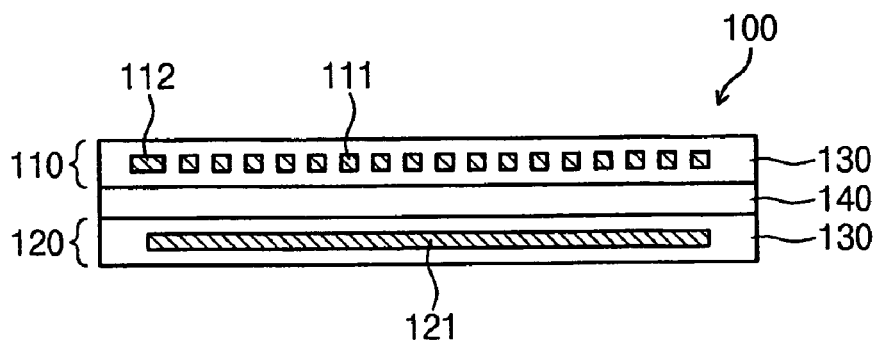
FIGS. 6 and 7 are cross-sectional views of an embodiment of the interconnection structure according to aspects of the present invention, which are taken in another direction.
Figure 7:
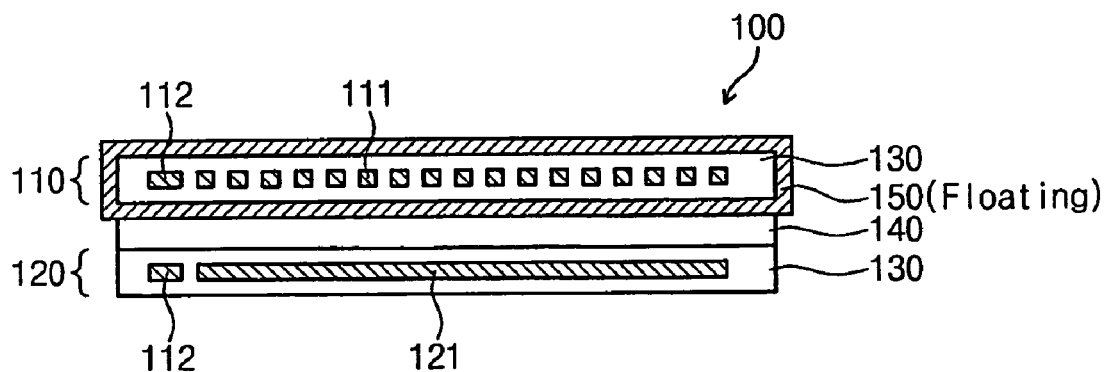
Figure 8:
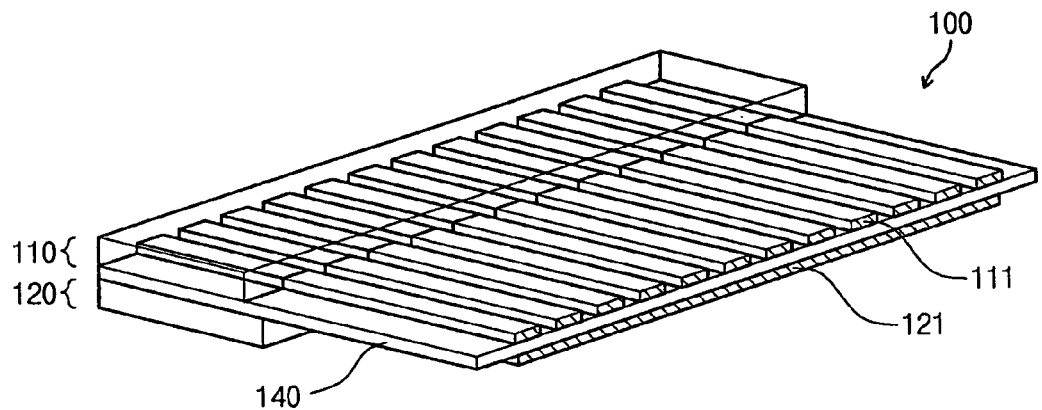
FIGS. 8 and 9 are perspective views of an embodiment of the interconnection structure according to aspects of the present invention.
Figure 9:
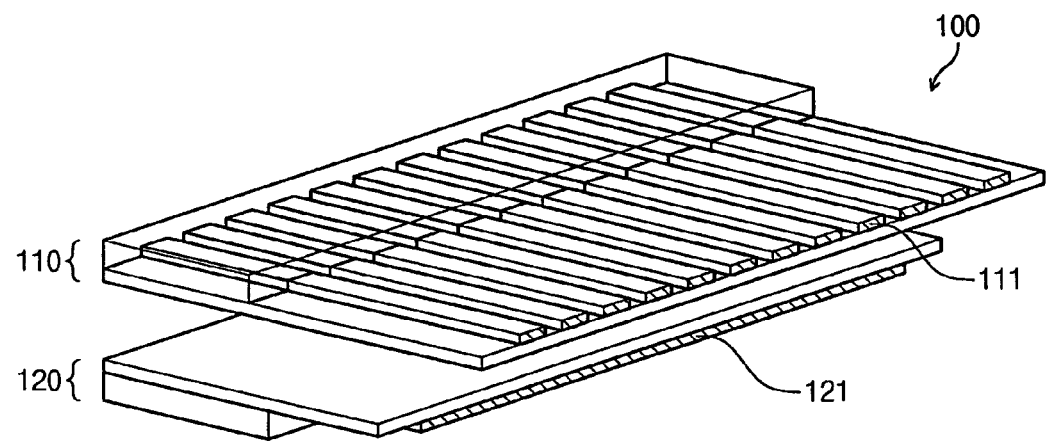

FIGS. 3 through 5 are cross-sectional views of an embodiment of an interconnection structure 100 according to aspects of the present invention, which are taken in a first direction. FIGS. 6 and 7 are cross-sectional views of an embodiment of the interconnection structure 100 according to aspects of the present invention, which are taken in another direction. Also, FIGS. 8 and 9 are perspective views of an embodiment of the interconnection structure 100 according to aspects of the present invention.

Referring to FIGS. 3 through 7, an interconnection structure according to an aspect of the present invention includes a first interconnection layer 110 and a second interconnection layer 120. A plurality of signal lines 111 for transmitting an operating signal are disposed in the first interconnection layer 110, while at least one ground line 121 for applying a ground voltage is disposed in the second interconnection layer 120. Thus, the operating signal and the ground voltage are transmitted through the signal line 111 and the ground line 121, respectively, so that the optical signal and the ground voltage are transmitted from a predetermined driver (e.g., the timing controller 300 of FIG. 1) to a predetermined receiver (e.g., the source and gate PCBs 40 and 50).

At least one insulating layer 130 is further disposed between the first and second interconnection layers 110 and 120 to electrically isolate the signal lines 111 from the ground line 121. In the present embodiment, a predetermined adhesive 140 can be further disposed between the first and second interconnection layers 110 and 120 to adhere the first interconnection layer 110 to the second interconnection layer 120. As illustrated in FIGS. 3 and 9, the adhesive 140 can be partially disposed in the center of the first and second interconnection layers 110 and 120 such that both outer portions of the first and second interconnection layers 110 and 120 are separated from each other.

Furthermore, a power supply line 112 for applying a power supply voltage can be further disposed in the first interconnection layer 110 (refer to FIG. 6). In a variation of the current embodiment of the present invention, the power supply line 112 can be disposed also in the second interconnection layer 112 (refer to FIG. 7).

According to aspects of the present invention, the length of the first interconnection layer 110 can be longer or equal to that of the second interconnection layer 120 (refer to FIGS. 3 and 4). Thus, a length L2 of the ground line 121 can be shorter or equal to a length L1 of the signal line 111. In this case, the distortion of the waveform of the operating signal can be reduced.

Meanwhile, according to the present invention, the ground line 121 can be formed to have a great width. Specifically, the ground line 121 can be formed to have a greater width than the sum of the widths of the signal lines 111, as illustrated in FIGS. 6 through 9. When the ground line 121 has a great width, a current path of the return current can be shortened and the interconnection resistance of the ground line 121 can be reduced, so that the distortion of the waveform of the operating signal can be reduced more effectively.

In another embodiment, a shielding layer 150 can be further disposed between the first and second interconnection layers 110 and 120. For example, as illustrated in FIG. 7, the shielding layer 150 can extend and wind around the first interconnection layer 110 having the signal lines 111 to minimize the electromagnetic interference (EMI) caused in the signal lines 111. In this case, the shielding layer 150 can be electrically floated.

Figure 10:
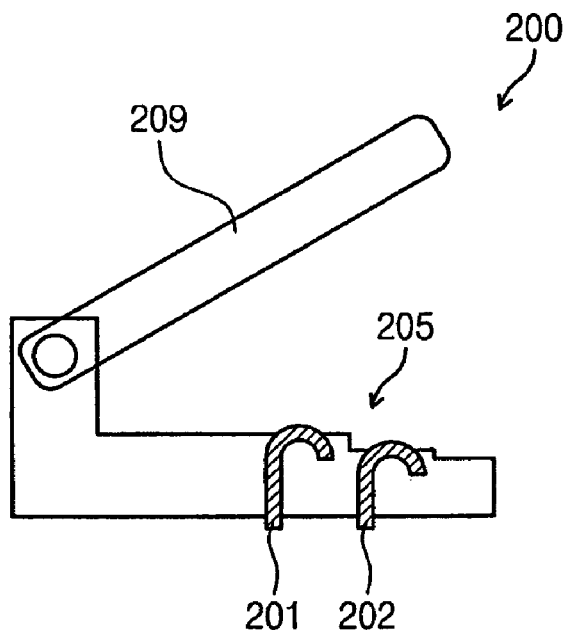
FIGS. 10 through 12 are perspective views of an embodiment of a connector according to an aspect of the present invention.
Figure 11:
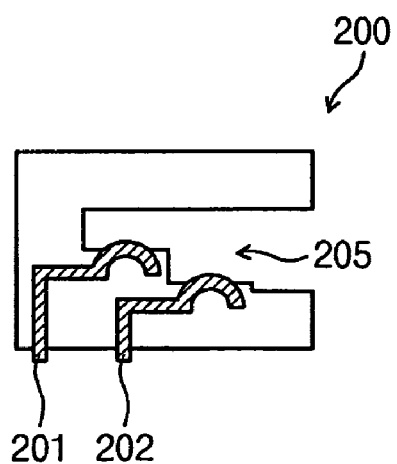
Figure 12:
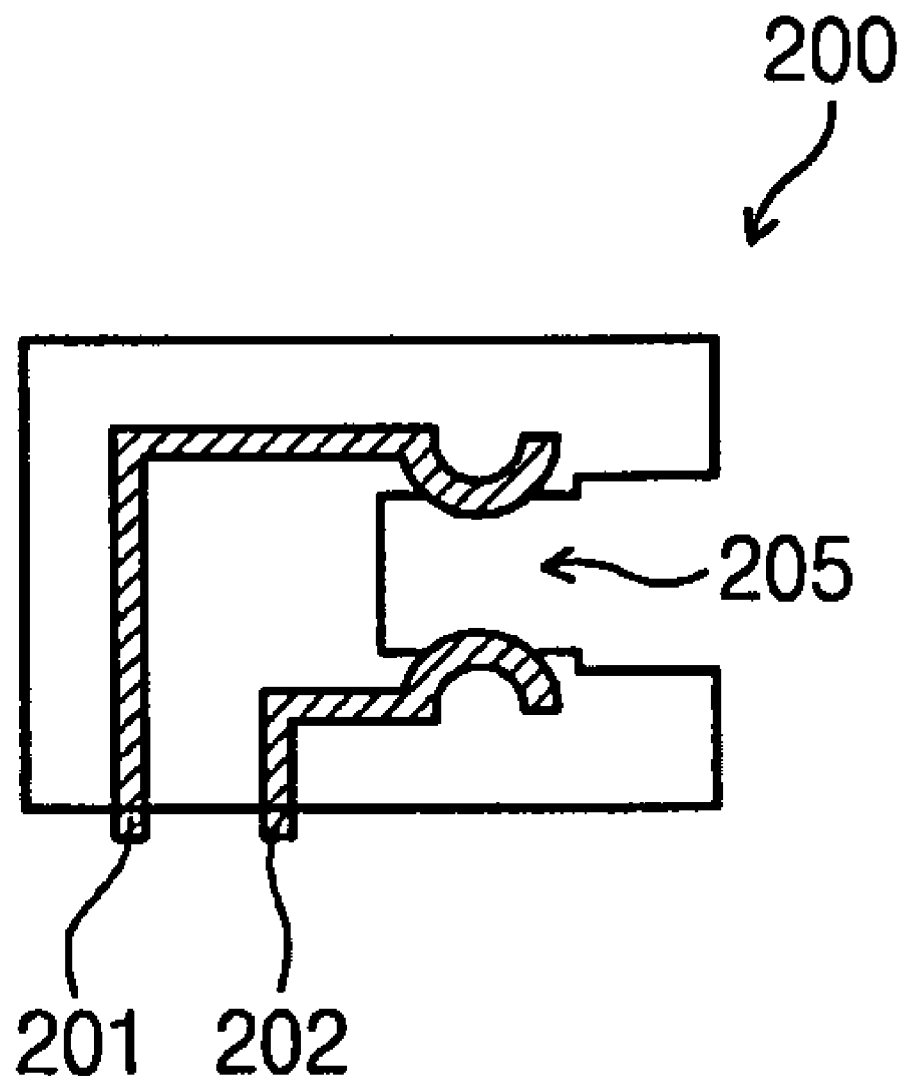

FIGS. 10 through 12 are perspective views of an embodiment of a connector 200 according to an aspect of the present invention.

Referring to FIGS. 10 through 12, the connector 200 includes a socket unit 205 corresponding to the structure of the foregoing interconnection structure 100. More specifically, the socket 205 includes a first socket unit and a second socket unit having shapes corresponding to the structures of the first and second interconnection layers 110 and 120 so that the first and second interconnection layers 110 and 120 can be inserted into the first and second interconnection layers 110 and 120, respectively. In this case, as illustrated in FIGS. 10 and 11, the first socket unit can have a greater socket than the second socket unit, and the connector 200 according to the current embodiment is appropriate for the interconnection structure 100 described with reference to FIGS. 3 and 4. Alternatively, as illustrated in FIG. 12, the first and second socket units can be formed to have the same depth, and the connector 200 according to the current embodiment is appropriate for the interconnection structure 100 described with reference to FIGS. 5 and 8.

Furthermore, the socket unit 205 can include signal terminals 201, a power supply terminal (not shown), and a ground terminal 202, which are electrically connected to the signal lines 111, the power supply line 112, and the ground line 121, respectively. The signal terminals 201, the power supply terminal, and the ground terminal 202 can extend outside the connector 200 and be electrically connected to the timing controller 300 and the source and gate PCBs 40 and 50. Also, as illustrated in FIG. 10, the connector 200 can further include a predetermined pressing element 209, which helps stably bring the signal lines 111, the power supply line 112, and the ground line 121 into contact with the signal terminals 201, the power supply terminal, and the ground terminal 202, respectively.

Figure 13:
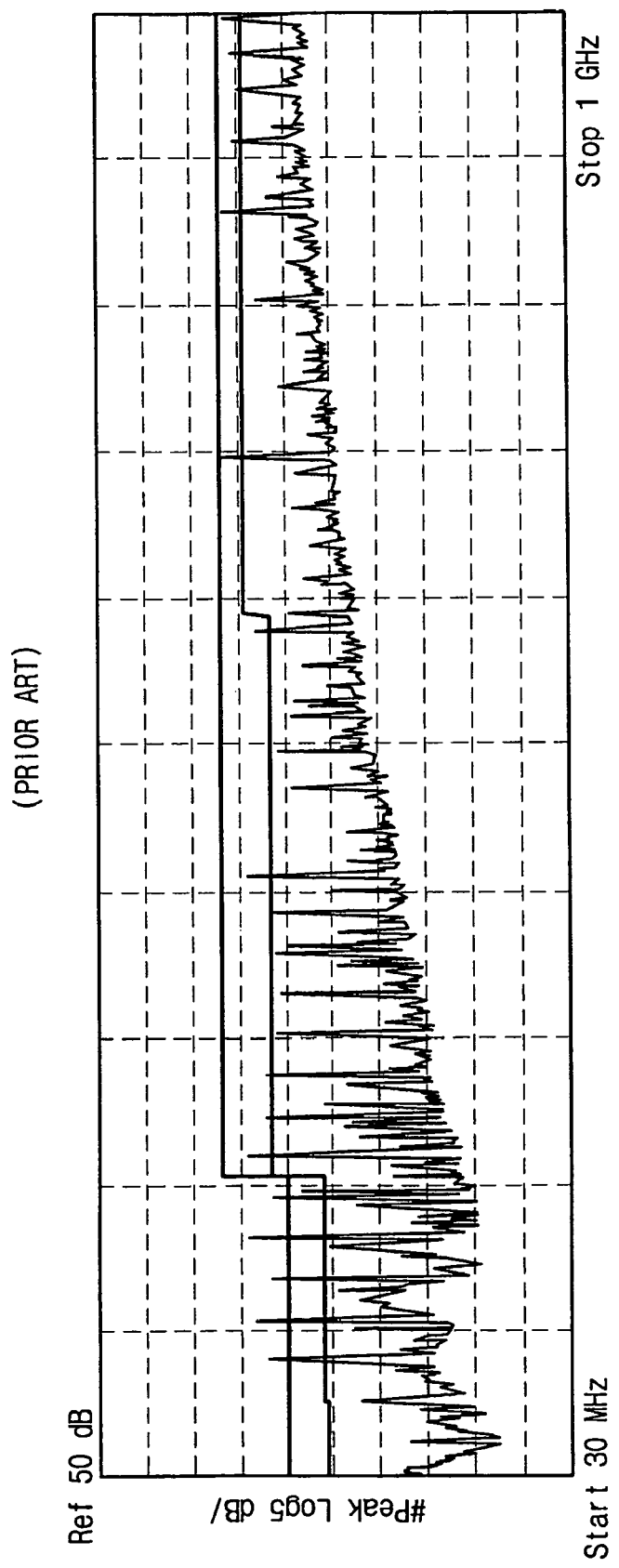
FIG. 13 is a graph of measurement results showing the electromagnetic interference (EMI) of a conventional connection structure.
Figure 14:
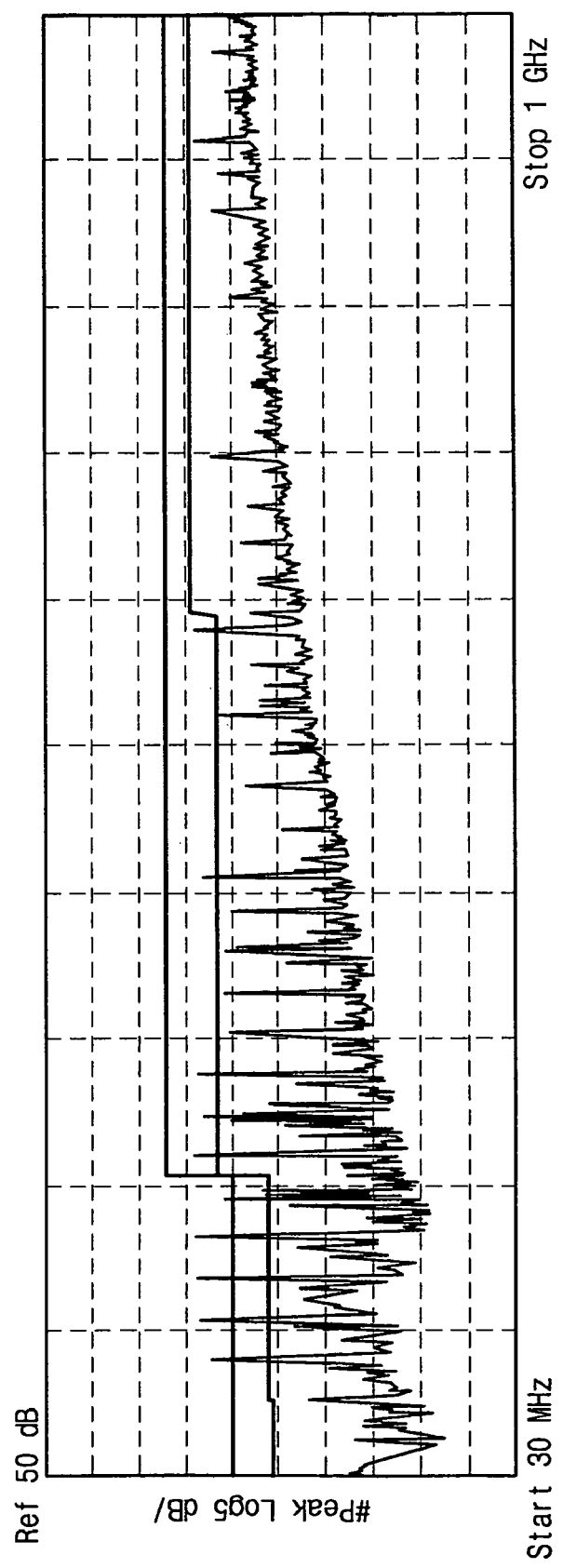
FIG. 14 is a graph of measurement results showing the EMI of a connection structure according to aspects of the present invention.

FIG. 13 is a graph of measurement results showing the EMI of a conventional connection structure, and FIG. 14 is a graph of measurement results showing the EMI of a connection structure according to aspects of the present invention.

The results of FIG. 13 were obtained using a connection structure including an interconnection structure in which a single interconnection layer has signal lines, a ground line, and a power supply line and a connector corresponding to the structure of the interconnection structure. In comparison, the results of FIG. 14 were obtained using the above-described connection structure according to the embodiment in which an interconnection structure has a ground line with a great width disposed under signal lines. Therefore, it can be understood that a difference between the results of FIGS. 13 and 14 is made due to the fact that the interconnection structure according to aspects of the present invention further includes a second interconnection layer having the ground line.

Referring to FIGS. 13 and 14, the intensity of a signal noise of the connection structure according to aspects of the present invention was 5 dB higher in a frequency range of 700 MHz or faster than in the conventional case. In a frequency range of 700 MHz or slower, no significant difference was observed in the intensity of a signal noise between the conventional connection structure and the connection structure according to aspects of the present invention. Therefore, it can be seen that the second interconnection layer having the added ground line is effective in reducing a signal noise in a high-frequency range.

According to aspects of the present invention, a connection structure including a double layered interconnection structure is provided. The double layered interconnection structure includes a first interconnection layer having signal lines for transmitting an operating signal and a second interconnection layer having a ground line for applying a ground voltage. In this case, since the ground line helps reduce a signal noise in a high-frequency range, the distortion of a signal due to the transient voltage of a return current can be reduced.

It will be apparent to those skilled in the art that various modifications and variations can be made in accordance with aspects of the present invention. Thus, it is intended that the present invention is defined by the appended claims, which include the modifications and variations of this invention that come within the scope of the appended claims and their equivalents.

What is claimed is:

1. A connection structure comprising:
    a first interconnection layer including a plurality of signal lines configured to transmit an operating signal generated by a driver to a receiver;
    a second interconnection layer including at least one ground line configured to connect ground terminals of the driver and the receiver; and
    an insulating layer interposed between the first and second interconnection layers to electrically insulate the signal lines from the ground line,
    wherein the plurality of signal lines is longer than the at least one ground line and the insulating layer interposed between the first and second interconnection layers exposes a portion of the plurality of signal lines without exposing a corresponding portion of the at least one ground line.

2. The structure according to claim 1, wherein the length of the ground line is shorter than or equal to the length of the signal lines.

3. The structure according to claim 1, wherein the width of the ground line is greater than the sum of the widths of the signal lines.

4. The structure according to claim 1, wherein the insulating layer further comprises an adhesive layer configured to adhere the insulating layer to the first and second interconnection layers.

5. The structure according to claim 1, further comprising a shielding layer interposed between the first and second interconnection layers and electrically floated.

6. The structure according to claim 5, wherein the shielding layer extends and encloses the first interconnection layer.

7. The structure according to claim 1, further comprising at least one power supply line configured to connect ground terminals of the driver and the receiver,
    wherein the power supply line is disposed in at least one of the first and second interconnection layers.

8. The structure according to claim 1, further comprising a connector configured to connect the first and second interconnection layers to one of the driver and the receiver,
    wherein the connector includes signal terminals connected to the signal lines of the first interconnection layer and a ground terminal connected to the ground line of the second interconnection layer.

9. The structure according to claim 8, wherein the connector includes a first socket unit into which the first interconnection layer is inserted and a second socket unit into which the second interconnection layer is inserted,
    wherein the second socket unit has a greater socket depth than the first socket unit.

10. The structure according to claim 1, wherein the driver is a timing controller of a liquid crystal display (LCD), and the receiver is a gate/source driver circuit of the LCD.

11. A liquid crystal display (LCD) comprising:
    a timing controller including a first connector;
    a panel on which gate/source driver circuits including second connectors are disposed; and
    an interconnection structure inserted into the first and second connectors and configured to connect the timing controller and the gate/source driver circuits, wherein the interconnection structure comprises:
    a first interconnection layer including signal lines configured to transmit an operating signal generated by the timing controller to the gate/source driver circuits;
    a second interconnection layer including a ground line configured to connect the timing controller and ground terminals of the gate/source driver circuit; and
    an insulating layer interposed between the first and second interconnection layers to electrically insulate the signal lines from the ground line,
    wherein the signal lines are longer than the ground line and the insulating layer interposed between the first and second interconnection layers exposes a portion of the signal lines without exposing a corresponding portion of the at least one ground line.

12. The LCD according to claim 11, wherein the length of the ground line is shorter than or equal to the length of the signal lines.

13. The LCD according to claim 11, wherein the width of the ground line is greater than the sum of the widths of the signal lines.

14. The LCD according to claim 11, wherein the interconnection structure further comprises:
    an insulating layer interposed between the first and second interconnection layers and configured to electrically isolate the first interconnection layer from the second interconnection layer; and
    an adhesive layer interposed between the insulating layer and the first and second interconnection layers.

15. The LCD according to claim 11, wherein the interconnection structure further includes a shielding layer interposed between the first and second interconnection layers and electrically floated.

16. The LCD according to claim 15, wherein the shielding layer is extended to enclose the first interconnection layer.

17. The LCD according to claim 11, wherein the interconnection structure further comprises at least one power supply line configured to connect the timing controller and the ground terminals of the gate/source driver circuits,
    wherein the power supply line is disposed in at least one of the first and second interconnection layers.

18. The LCD according to claim 11, wherein each of the first and second connectors includes signal terminals connected to the signal lines of the first interconnection layer and a ground terminal connected to the ground line of the second interconnection layer.

19. The LCD according to claim 18, wherein each of the first and second connectors includes a first socket unit into which the first interconnection layer is inserted and a second socket unit into which the second interconnection layer is inserted,
    wherein the second socket unit has a greater socket depth than the first socket unit.

* * * * *